United States Patent
Hafskjold et al.

(10) Patent No.: US 6,867,364 B2
(45) Date of Patent: Mar. 15, 2005

(54) SYSTEM FOR DISTRIBUTION OF ELECTRIC POWER

(75) Inventors: Gunnar Hafskjold, Drammen (NO); Nils-Arne Sølvik, Houston, TX (US)

(73) Assignee: ABB Offshore Systems AS, Billingstad (NO)

( * ) Notice: Subject to any disclaimer, the term of this patent is extended or adjusted under 35 U.S.C. 154(b) by 0 days.

(21) Appl. No.: 10/416,715

(22) PCT Filed: Nov. 14, 2001

(86) PCT No.: PCT/NO01/00453

§ 371 (c)(1),
(2), (4) Date: Sep. 11, 2003

(87) PCT Pub. No.: WO02/41336

PCT Pub. Date: May 23, 2002

(65) Prior Publication Data

US 2004/0051615 A1 Mar. 18, 2004

(30) Foreign Application Priority Data

Nov. 14, 2000 (NO) .......................................... 20005753

(51) Int. Cl.[7] ................................................ H02G 3/08
(52) U.S. Cl. ........................... 174/50; 174/5 R; 174/18; 174/17 CT; 336/90
(58) Field of Search .......................... 174/50, 18, 5 R, 174/17 CT; 403/292; 220/4.02; 312/326; 336/90

(56) References Cited

U.S. PATENT DOCUMENTS

| | | | | |
|---|---|---|---|---|
| 6,066,802 A | * | 5/2000 | Reinke et al. | 174/50 |
| 6,140,572 A | * | 10/2000 | Book | 174/17 CT |
| 6,371,693 B1 | * | 4/2002 | Kopp et al. | 405/158 |
| 6,683,249 B1 | * | 1/2004 | Leppin | 174/50 |

FOREIGN PATENT DOCUMENTS

| | | |
|---|---|---|
| EP | 1113547 A1 | 7/2001 |
| GB | 2028003 A | 2/1980 |
| GB | 1604978 | 12/1981 |
| WO | 99/63555 | 12/1999 |

* cited by examiner

*Primary Examiner*—Dhiru R. Patel
(74) *Attorney, Agent, or Firm*—Venable LLP; Eric J. Franklin

(57) ABSTRACT

A subsea electrical power distribution system including a first chamber (20) housing a transformer, a second chamber (30) housing a power distribution system with busbars (32) for distribution of power to individual consumers connected to said busbars via connectors (33). The interface between the first and second chamber includes a flexible membrane (22) allowing the oil in the first chamber to expand into the second chamber and vice versa. The second chamber being connected to an external volume expansion chamber (34) allowing the pressure in the second chamber to balance against the pressure of the ambient sea.

19 Claims, 3 Drawing Sheets

SYSTEM FOR DISTRIBUTION OF ELECTRIC POWER

FIELD OF THE INVENTION

The present invention relates to a system for distribution of electric power between a transmission system and local consumers, especially in a subsea environment.

TECHNICAL BACKGROUND

In said system the transformer is the electrical link between the high voltage transmission system and the local distribution system. The output from the transformer is connected to a separate distribution or switchboard unit connecting the transformer to the user equipment.

Transformers for subsea installations customary consist of a chamber housing the transformer proper with core and copper windings. This chamber is filled with transformer oil. To balance the internal pressure of the chamber to the ambient seawater pressure, the transformer assembly is equipped with a volume compensator in the form of an external expansion chamber.

This compensator constitutes a barrier against the surrounding water that is important for the correct operation of the transformer. Water leaking into the transformer chamber can cause electric shorts between the windings, which damages the transformer. The oil has very little ability to absorb contaminant water. To maintain this barrier intact is a problem for the manufacturer as the unit experiences a great span of pressures from the surface down to the sea bottom. An eventual leak will also pose a pollution problem.

The distribution unit is contained in its own oil filled housing with pressure compensation mechanism, separate from the transformer housing.

SUMMARY OF THE INVENTION

The object of the present invention is to provide an improved arrangement of the transformer and the distribution unit in a system for distribution of electric power, especially in a submarine environment.

This is achieved by a system including a transformer arranged in a first chamber, said first chamber being filled with an insulating medium, and a distribution unit arranged in a second chamber, said distribution unit being connected to the transformer and comprising connections for connection of the distribution system to the consumers, said second chamber being filled with an insulating medium, wherein the transformer and the distribution unit are combined into a single module, the insulating medium in the first chamber being separated from the insulating medium in the second chamber, and the module comprises a first volume compensation device for equalising the pressure between the insulating medium in the first chamber and the insulating medium in the second chamber, and a second volume compensation device for equalising the pressure between the insulating medium in the second chamber and an ambient medium surrounding the module.

One advantage of integrating the transformer and the distribution unit into one module is that there are fewer electrical connections exposed to the seawater or any other ambient medium, and thus the reliability is increased. Integrating the distribution unit and the transformer into the same subsea module results in fewer interfaces exposed to the ambient medium.

Another advantage of the present invention is that the second chamber will serve as an additional barrier for the transformer. This additional barrier will eliminate the need for a double tank design of the transformer housing.

The integration of the distribution unit and the transformer into one single module will also reduce the number of control/monitoring interfaces. This integration will also imply that a reduced number of separate units have to be installed subsea and that a reduced number of electric connections have to be made up subsea.

Preferred embodiments as well as advantageous features of the invention will appear from the following description.

BRIEF DESCRIPTION OF THE DRAWINGS

The invention will be described in detail with reference to the appended drawings, in which.

DESCRIPTION OF EMBODIMENTS OF THE INVENTION

Figure 1:
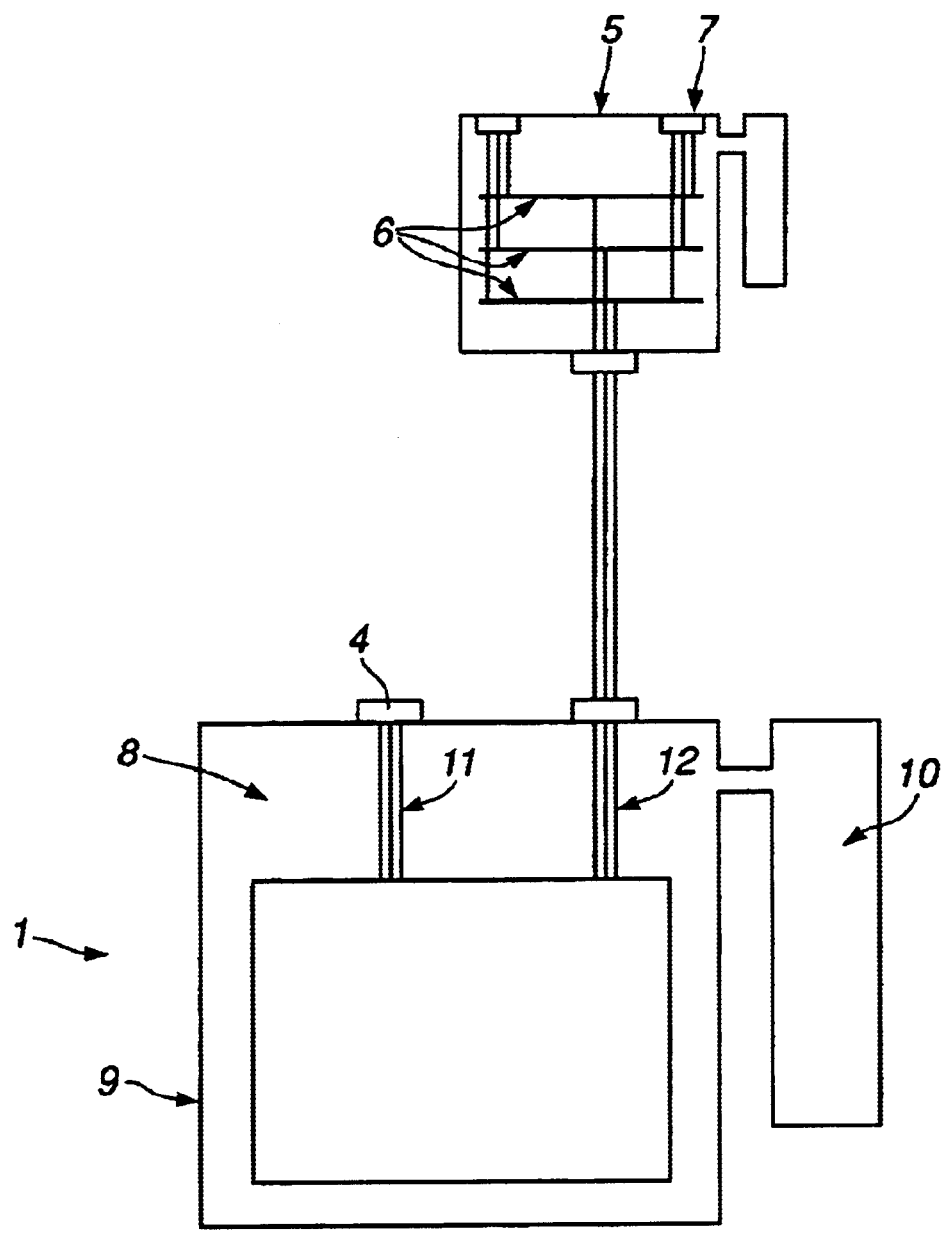
FIG. 1 shows an arrangement of a transformer unit with volume expansion tank and a separate distribution unit, according to prior art.

FIG. 1 gives an overview of a subsea power distribution system according to prior art. In said system the transformer 1 is the electrical link between a high voltage transmission system and a local distribution system. The transmission voltage, typically 11 kV–36 kV, is transformed down to a distribution level, typically 3.0 kV–12.0 kV. The traditional design of a transformer is to have a single three-phase primary connection 11 and a single three-phase secondary connection 12. The primary input is connected to the transmission line via a high voltage connector 4 mounted on the top of the transformer housing 9.

The secondary output 12 from the transformer is connected to a separate distribution or switchboard unit 5. The distribution components in said unit include a busbar arrangement with connectors and switches connecting the transformer to the consumer equipment. There is one busbar 6 per phase. The consumers are connected to the busbars 6 via connectors 7 mounted on the wall of the housing.

The transformer unit 1 comprises a chamber 8 housing the transformer core and windings. The transformer chamber 8 is filled with transformer oil. The oil serve to cool the transformer by transferring the heat developed in the transformer windings to the outer wall 9. Said wall 9 is equipped with ribs on the outside to promote the transfer of heat into the surrounding water mass.

To balance the internal pressure of the chamber 8 to the ambient seawater pressure, the transformer unit 1 is equipped with a volume compensator in the form of an external expansion chamber 10. The expansion chamber 10 is in fluid communication with the oil inside the transformer chamber 8, and in fluid communication with the external water via a membrane or/and a piston.

This oil filled chamber 8 constitutes a barrier, which protects the transformer against the ambient seawater.

Figure 2:
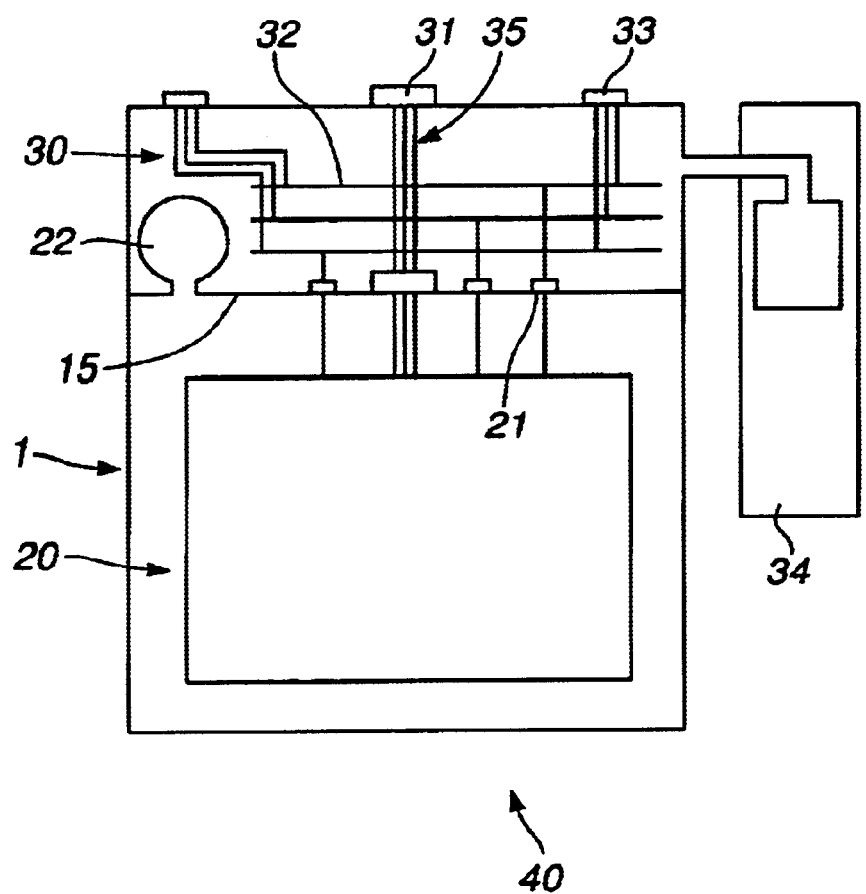
FIG. 2 shows a schematical cross section of a power distribution system according to an embodiment of the present invention.

FIG. 2 shows a system for distribution of electric power between a transmission system and local consumers, especially in a subsea environment, according to an embodiment of the present invention. Here, the transformer and distribution unit are combined into a single module 40. The module 40 includes a first chamber 20 containing the transformer with its core and windings. This first chamber 20 is filled with an insulating medium, preferably in the form of transformer oil. The module 40 also includes a second chamber 30 containing the distribution unit, said unit being connected to the transformer and comprising connections 33 for connection of the system to the consumers. The second chamber 30 is also filled with an insulating medium, preferably in the form of oil. The second chamber 30 is suitably mounted above the first chamber 20, as illustrated in FIG. 2. However, the second chamber 30 could, if so desired, be located at the side of or below the first chamber 20. The first chamber 20 and the second chamber 30 are preferably arranged directly adjacent to each other separated by an intermediate wall 15, as illustrated in FIG. 2.

The insulating medium in the first chamber 20 is separated from the insulating medium in the second chamber 30 so as not to allow the media in the two chambers to mix with each other. The module 40 has a two step volume compensation system comprising at least two different volume compensation devices. The module 40 comprises a first volume compensation device for equalizing the pressure between the insulating medium in the first chamber 20 and the insulating medium in the second chamber 30, and a second volume compensation device for equalizing the pressure between the insulating medium in the second chamber 30 and an ambient medium, such as seawater, surrounding the module 40.

In the embodiment illustrated in FIG. 2, the first volume compensation device 22 comprises a flexible membrane, preferably of rubber, arranged in the interface between the first and second chambers 20, 30, i.e. here in the wall separating the two chambers. The flexible membrane 22 allows the insulating medium of the first chamber 20 to expand into the second chamber 30 and vice versa. The flexible membrane will consequently compensate for expansion/contraction of the insulating medium in the first chamber 20 into or out of the second chamber 30. The first volume compensation device could as well comprise several separate flexible membranes arranged in the interface between the first and second chambers 20, 30.

In the embodiment illustrated in FIG. 2, the second volume compensation device comprises an expansion chamber. The insulating medium in the second chamber 30 is compensated to the ambient medium, i.e. the medium surrounding the module 40, by this expansion chamber. According to a preferred embodiment of the invention, the expansion chamber 34 includes a flexible membrane and/or a piston, the expansion chamber 34 being in fluid communication with the second chamber 30 on a first side of said membrane/piston, and in fluid communication with the ambient medium on the other side of said membrane/piston. Said membrane is suitable formed as a bladder. The second volume compensation device could as well comprise several separate expansion chambers.

Figure 3:
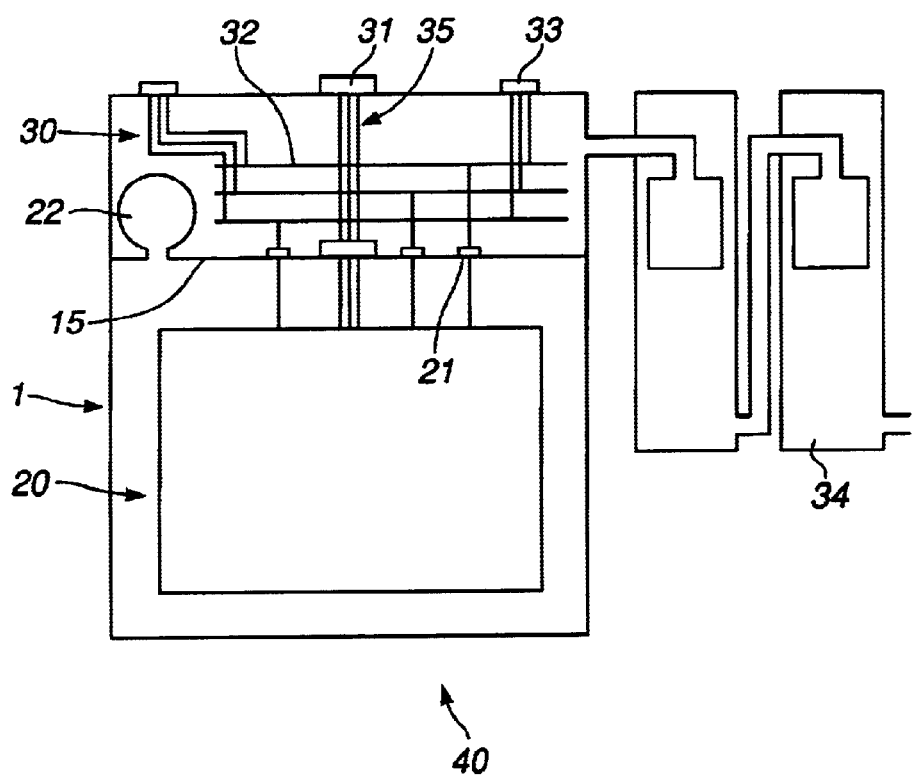
FIG. 3 shows a very schematical illustration of a volume compensation device included in a preferred embodiment of the present invention.

According to a particularly preferred embodiment of the invention, the second volume compensation device comprises two series connected expansion chambers, as schematically illustrated in FIG. 3.

The external, second volume compensator is the weakest link in regard to keeping ambient seawater out of the system. The external compensator 34 is attached to the second chamber 30, even if the volume of the insulating medium in the first chamber 20 is greater than the volume of the insulating medium in the second chamber 30. This will require a bigger internal membrane between the two chambers, but will also create an extra barrier for the transformer towards the ambient seawater. Consequently, ambient seawater that, for some reason, might leak into the module 40 via the external compensator will by the internal, first volume compensation device be prevented from reaching the transformer. In this way, the transformer will in a very efficient manner be protected from the ambient seawater.

The module 40 is provided with a high voltage connection 31 for connection of the transformer to the transmission voltage of a transmission system. In the embodiment illustrated in FIG. 2, said high voltage connection 31 is arranged on an outer wall of the second chamber 30. As previously mentioned, the module is also provided with connections 33 for connection to the consumers. In the embodiment illustrated in FIG. 2, the last mentioned connections 33 are also arranged on an outer wall of the second chamber 30. The distribution unit includes a number of busbars 32, one for each phase of the secondary windings of the transformer, each busbar 32 being connected to the associated secondary winding and to the connections 33. In the embodiment illustrated in FIG. 2, each busbar 32 is connected to the associated secondary winding of the transformer via a conductor 35 penetrating the wall between the first 20 and second 30 chamber.

In the embodiment illustrated in FIG. 2, the transmission voltage is entering the upper chamber through the high voltage connection 31, continues through the upper, second chamber 30, penetrates the top cover of the lower, first chamber 20 and connects to the primary windings of the transformer. The secondary output from the transformer penetrates the top cover of the lower, first chamber 20 via bushings 21, and is connected to the individual busbars 32 in the upper, second chamber 30. Distribution to the consumers is via a number of external connections 33 coupled to the busbars 32. The upper, second chamber 30 may contain a more complex distribution unit than here described, including switches for turning on/off the individual consumers etc.

The module 40 preferably comprises at least one sensor for monitoring temperature and/or at least one sensor for monitoring pressure (not shown). A hydrogen sensor may be incorporated in the module 40 in order to indicate partial discharges (PD). A high hydrogen concentration is an indication of high PD activity in the transformer, which often is caused by water in the insulating oil. The monitoring sensors suitably communicate directly with the subsea distribution unit, i.e. there are no electronic cards inside the first chamber 20.

The invention is of course not in any way resricted to the preffered embodiments described above, but many possibilities to modifications thereof will be apparent to a man with with ordinary skill in the art without departing from the basic idea of the invention such as defined in the appended claims.

What is claimed is:

1. A system for distribution of electric power between a transmission system and local consumers, the system comprising:

a first chamber filled with an insulating medium;

a second chamber filled with an insulating medium, wherein the first chamber and the second chamber are arranged adjacent to each other and the insulating medium in the first chamber is separated from the insulating medium in the second chamber;

an intermediate wall separating the first chamber from the second chamber;

a transformer arranged in the first chamber;

a distribution unit arranged in the second chamber, said distribution unit being connected to the transformer and comprising connections for connection of the distribution system to the consumers, wherein the transformer and the distribution unit are integrated into a single module, the module comprising a first volume compensation device for equalizing the pressure between the insulating medium in the first chamber and the insulating medium in the second chamber, and a second volume compensation device for equalizing the pressure between the insulating medium in the second chamber and an ambient medium surrounding the module.

2. The system according to claim 1, wherein the first volume compensation device comprises a flexible membrane, arranged in the intermediate wall between the first and second chambers.

3. The system according to claim 2, wherein the flexible membrane is arranged in said intermediate wall.

4. The system according to claim 2, wherein the flexible membrane is arranged to allow the insulating medium of the first chamber to expand into the second chamber.

5. The system according to claim 2, wherein the flexible membrane comprises rubber.

6. The system according to claim 1, wherein the second volume compensation device comprises an expansion chamber.

7. The system according to claim 6, wherein the expansion chamber includes a flexible membrane, the expansion chamber being in fluid communication with the second chamber on a first side of said membrane, and in fluid communication with the ambient medium on the other side of said membrane.

8. The system according to claim 6, wherein the second volume compensation device comprises two series connected expansion chambers.

9. The system according to claim 6, wherein the expansion chamber includes a flexible membrane and a piston, the expansion chamber being in fluid communication with the second chamber on a first side of said membrane/piston, and in fluid communication with the ambient medium on the other side of said membrane/piston.

10. The system according to claim 6, wherein the expansion chamber includes a piston, the expansion chamber being in fluid communication with the second chamber on a first side of said piston, and in fluid communication with the ambient medium on the other side of said piston.

11. The system according to claim 1, wherein the distribution unit includes a number of busbars, one for each phase of the secondary windings of the transformer, each busbar being connected to the associated secondary winding via a conductor penetrating the wall between the first and second chamber, each busbar being connected to connections arranged on an outer wall of the second chamber.

12. The system according to claim 1, wherein the insulating medium in the first chamber is transformer oil.

13. The system according to claim 1, wherein an insulating medium in the second chamber is oil.

14. The system according to claim 1, wherein the second chamber is mounted above the first chamber.

15. The system according to claim 1, wherein a high-voltage connection for connection of the module to a transmission system is arranged on a wall of the second chamber, the primary windings of the transformer being connected to said high-voltage connection via a conductor extending through the second chamber and penetrating the wall between the first and second chamber.

16. The system according to claim 1, wherein the module is provided with a sensor for monitoring temperature.

17. The system according to claim 1, wherein the module is provided with a sensor for monitoring pressure.

18. The system according to claim 1, wherein the module is provided with a hydrogen sensor for detecting partial discharges in the transformer.

19. The according to claim 1, wherein the environment is a subsea environment.

* * * * *